(12) United States Patent
Kawaguchi et al.

(10) Patent No.: US 7,441,745 B2
(45) Date of Patent: Oct. 28, 2008

(54) MOLD, AND PROCESS FOR PRODUCING BASE MATERIAL HAVING TRANSFERRED MICROPATTERN

(75) Inventors: Yasuhide Kawaguchi, Yokohama (JP); Yoshihiko Sakane, Yokohama (JP); Daisuke Shirakawa, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/754,526

(22) Filed: May 29, 2007

(65) Prior Publication Data

US 2007/0228619 A1    Oct. 4, 2007

Related U.S. Application Data

(63) Continuation of application No. PCT/JP2005/021821, filed on Nov. 28, 2005.

(30) Foreign Application Priority Data

Nov. 30, 2004   (JP)   ............................. 2004-346029
Aug. 29, 2005   (JP)   ............................. 2005-247722

(51) Int. Cl.
*B29C 35/08*   (2006.01)
*B29C 33/56*   (2006.01)

(52) U.S. Cl. .................... 249/114.1; 249/115; 106/38.2

(58) Field of Classification Search ............. 249/114.1, 249/115; 425/174, 115, 375, 385, 386, 445, 425/446, 810; 106/38.2, 38.22, 38.27, 38.28
See application file for complete search history.

(56) References Cited

U.S. PATENT DOCUMENTS

| | | | | |
|---|---|---|---|---|
| 3,808,249 A * | 4/1974 | Koshar et al. ............... 556/427 |
| 5,492,587 A * | 2/1996 | Hong .......................... 156/246 |
| 5,543,217 A * | 8/1996 | Morgan ....................... 428/375 |
| 5,688,642 A * | 11/1997 | Chrisey et al. ................. 435/6 |
| 6,284,072 B1 * | 9/2001 | Ryan et al. ..................... 156/59 |
| 6,517,995 B1 * | 2/2003 | Jacobson et al. ............ 430/320 |
| 6,692,817 B1 * | 2/2004 | Silva et al. ............... 428/195.1 |
| 7,070,406 B2 * | 7/2006 | Jeans ....................... 425/174.4 |
| 2002/0084553 A1 * | 7/2002 | Nun et al. .................... 264/284 |
| 2003/0071016 A1 * | 4/2003 | Shih et al. ...................... 216/54 |
| 2003/0152864 A1 * | 8/2003 | Araki et al. ............... 430/270.1 |
| 2005/0167894 A1 * | 8/2005 | Shih et al. .................... 264/496 |
| 2007/0228619 A1 | 10/2007 | Kawaguchi et al. |
| 2007/0254278 A1 * | 11/2007 | DeSimone et al. ............. 435/5 |

FOREIGN PATENT DOCUMENTS

| | | |
|---|---|---|
| JP | 46-27514 | 9/1971 |
| JP | 1-33296 | 10/1989 |
| JP | 5-245848 | 9/1993 |
| JP | 2000-108137 | 4/2000 |

(Continued)

OTHER PUBLICATIONS

U.S. Appl. No. 11/876,182, filed Oct. 22, 2007, Kawaguchi et al.

*Primary Examiner*—Philip C Tucker
*Assistant Examiner*—Dimple N Bodawala
(74) *Attorney, Agent, or Firm*—Oblon, Spivak, McClelland, Maier & Neustadt, P.C.

(57) ABSTRACT

A mold and a process for producing a base material having a transferred micropattern, wherein the mold comprises a transparent substrate having chemical bonds resulting from functional groups (x) on a surface on which an interlayer (A) is formed, the interlayer (A) present between the surface of the transparent substrate and a surface layer (B) which has a micropattern for molding a photocurable resin, wherein interlayer (A) is a layer made of a fluoropolymer (1) which is a fluoropolymer having a fluorinated alicyclic structure in its main chain and which has reactive groups (y) reactive with functional groups (x), and surface layer (B) is a layer made of a fluoropolymer (2) which is a fluoropolymer having a fluorinated alicyclic structure in its main chain and which has substantially no reactive groups (y).

7 Claims, 1 Drawing Sheet

FOREIGN PATENT DOCUMENTS

| | | |
|---|---|---|
| JP | 2002-283354 | 10/2002 |
| JP | 2002-539604 | 11/2002 |
| JP | 2004-504718 | 2/2004 |
| JP | 2004346029 A * | 12/2004 |
| JP | 2005-515617 | 5/2005 |
| JP | 2006182011 A * | 7/2006 |

* cited by examiner

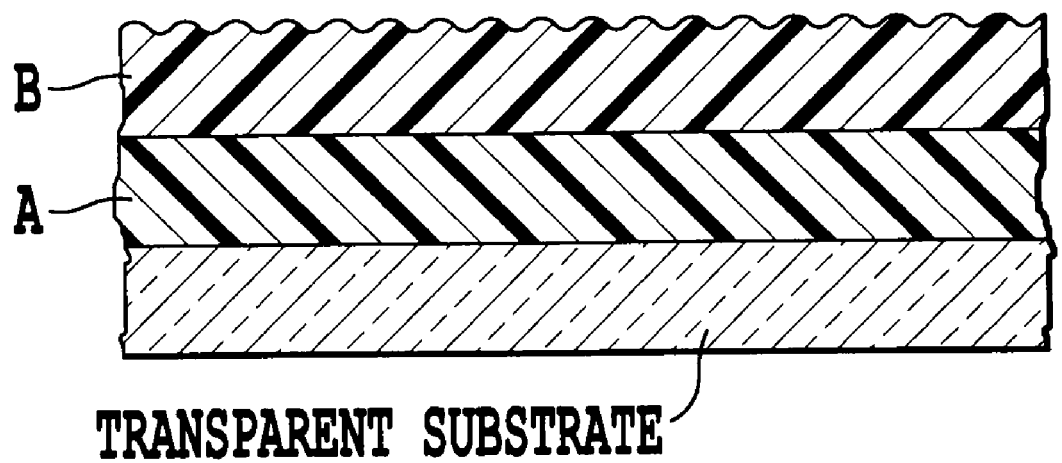

MOLD, AND PROCESS FOR PRODUCING BASE MATERIAL HAVING TRANSFERRED MICROPATTERN

TECHNICAL FIELD

The present invention relates to a mold, and a process for producing a base material having a transferred micropattern, made of a cured product of a photocurable resin, which employs the mold.

BACKGROUND ART

In recent years, attention has been drawn to a method (so-called a nano imprint method) wherein a base material is contacted with a mold having a micropattern on its surface to form on the base material surface a reversed pattern of the micropattern (Patent Documents 1 and 2).

Particularly, attention has been drawn to a process for producing a base material having a transferred micropattern and made of a cured product, which employs a mold having a micropattern on its surface, a base material and a photocurable resin and which comprises sequentially carrying out a step of interposing and pressing the photocurable resin between the micropattern surface of the mold and a surface of the base material, a step of applying light from the mold side to cure the photocurable resin to form a cured product, and a step of releasing the cured product from the mold.

As the mold to be used for such a process, a mold made of quartz is usually employed. However, such a mold has low release properties, whereby the precision of the micropattern tends to deteriorate at the time of releasing the cured product from the mold. As a method to improve the release properties, a method of applying a release agent on the micropattern surface of the mold has been proposed. However, due to irregularities in thickness of the applied release agent, the precision of the micropattern of the mold tends to deteriorate. Further, when the mold is used continuously, it is necessary to reapply the release agent, and the production efficiency tends to be low.

Patent Document 3 discloses a mold made of a tetrafluoroethylene polymer, an ethylene/tetrafluoroethylene copolymer or a perfluoroalkoxyvinyl ether polymer.

Patent Document 1: JP-A-2004-504718
Patent Document 2: JP-A-2002-539604
Patent Document 3: JP-A-2005-515617

BRIEF DESCRIPTION OF THE DRAWING

The FIGURE shows a cross section of the mold of the present invention, i.e., a transparent substrate, interlayer A and surface layer B having a micropattern on its outer surface, in that order.

DISCLOSURE OF THE INVENTION

Problems to be Solved By The Invention

However, the mold disclosed in Patent Document 3 is made of a specific fluoropolymer, whereby the mechanical strength and the shape stability are inadequate. For improvement to overcome such deficiency, it is conceivable to combine such a fluoropolymer with another substrate having mechanical strength and shape stability However, the fluoropolymer is nonadhesive, and it is not easy to combine such a mold with another substrate. Especially, it is not easy to firmly bond and combine a mold having a highly precise micropattern with another substrate It is an object of the present invention to provide a mold having a micropattern for molding a photocurable resin, which is provided with optical transparency, release properties and durability and which is provided also with mechanical strength, shape stability and dimensional precision of the micropattern.

Means to Solve the Problems

Namely, the present invention provides the following:

(1) A mold having a micropattern for molding a photocurable resin, which comprises a transparent substrate having chemical bonds resulting from functional groups (x) on a surface on which the following interlayer (A) is formed; the interlayer (A) present between said surface of the transparent substrate and the following surface layer (B); and the following surface layer (B) having a micropattern:

Interlayer (A): a layer made of a fluoropolymer (1) which is a fluoropolymer having a fluorinated alicyclic structure in its main chain and which has reactive groups (y) reactive with said functional groups (x)

Surface layer (B): a layer made of a fluoropolymer (2) which is a fluoropolymer having a fluorinated alicyclic structure in its main chain and which has substantially no reactive groups (y).

(2) A mold having a transparent substrate and a fluoropolymer layer having on its surface a micropattern for molding a photocurable resin, which comprises an interlayer (A) made of the following fluoropolymer (1) formed on a surface of the transparent substrate having functional groups (x) on the surface on which the following interlayer (A) is formed; and a surface layer is (B) having a micropattern, made of the following fluoropolymer (2) and formed on a surface of the interlayer (A):

Interlayer (A): a layer made of a fluoropolymer (1) which is a fluoropolymer having a fluorinated alicyclic structure in its main chain and which has reactive groups (y) reactive with said functional groups (x)

Surface layer (B): a layer made of a fluoropolymer (2) which is a fluoropolymer having a fluorinated alicyclic structure in its main chain and which has substantially no reactive groups (y).

(3) The mold according to the above (1) or (2), wherein the micropattern of the mold is constituted by a concave-convex convex structure wherein the average height of convex portions is from 1 nm to 300 μm.

(4) The mold according to any one of the above (1) to (3), wherein the functional groups (x) are hydroxyl groups, amino groups or oxiranyl groups, and the reactive groups (y) are carboxyl groups.

(5) The mold according to any one of the above (1) to (4), wherein the transparent substrate having functional groups (x) on its surface is a glass substrate having functional groups (x) introduced by surface treatment.

(6) A process for producing a base material having a transferred micropattern made of a cured product of a photocurable resin, which employs the mold as defined in any one of the above (1) to (5), a base material and a photocurable resin and which comprises sequentially carrying out a step of interposing and pressing the photocurable resin between the micropattern surface of the mold and a surface of the base material, a step of applying light from the mold side to cure the photocurable resin to form a cured product, and a step of releasing the cured product from the mold.

Effects of the Invention

The mold of the present invention is provided with the physical properties (the mechanical strength, etc.) of the transparent substrate and a highly precise micropattern, since the transparent substrate and the layer having a micropattern are firmly bonded via a specific layer. Further, the mold of the present invention is useful for molding a highly adhesive photocurable resin, since the micropattern portion of the mold is made of a highly non-adhesive fluoropolymer. Further, with the mold of the present invention, the micropattern portion is less susceptible to fouling even when repeatedly used.

Best Mode for Carrying Out The Invention

In the present invention, a compound represented by the formula (1) will be referred to as a compound 1. Compounds represented by other formula will be likewise referred to.

In the mold of the present invention, the transparent substrate is preferably a glass substrate (such as quartz or glass), a substrate made of a silicone resin or a substrate made of a transparent resin (such as a fluororesin, an acrylic resin, a polycarbonate resin or a polyimide resin), particularly preferably a glass substrate, since it is excellent in the mechanical strength. The shape of the transparent substrate may be flat (a flat plate-shape) or curved (a cylindrical shape, a triangular pyramid shape or a spherical shape).

The transparent substrate has a transmittance of light with a wavelength of from 200 to 500 nm being preferably at least 90%, particularly preferably at least 95%. Here, the transmittance of light means the transmittance of light through a transparent substrate having a thickness of 1 mm.

The functional groups (x) in the transparent substrate are preferably hydroxyl groups, oxiranyl groups or amino groups. The functional groups (x) may be functional groups derived from the material of the transparent substrate, or functional groups imparted to the surface of the transparent substrate by surface treatment to introduce functional groups (x). The functional groups (x) are preferably the latter functional groups, since it is thereby possible to optionally control the type and the amount.

The method for surface treatment to introduce functional groups (x) may, for example, be a method of treating the surface of the transparent substrate with a silane coupling agent having a functional group (x) or a method of treating the surface of the transparent substrate with a silazane compound having a functional group (x).

The silane coupling agent having a functional group (x) is preferably a silane coupling agent having an amino group (such as aminopropyl triethoxysilane, aminopropylmethyl diethoxysilane, aminoethyl-aminopropyl trimethoxysilane, or aminoethyl-aminopropylmethyl dimethoxysilane). Further, a silane coupling agent having an oxiranyl group (such as glycidoxypropyl trimethoxysilane or glycidoxypropylmethyl dimethoxysilane) is also preferred.

In the present invention, the fluoropolymer (1) constituting the interlayer (A) and the fluoropolymer (2) constituting the surface layer (B) are, respectively, fluoropolymers having fluorinated alicyclic structures in their main chains. Such a fluoropolymer is an amorphous or non-crystalline polymer, preferably a fluoropolymer having high transparency. The fluoropolymer (1) and the fluoropolymer (2) respectively have a transmittance of light with a wavelength of from 200 to 500 nm being preferably at least 90%. Here, the transmittance of light means the transmittance of light through the fluoropolymer having a thickness of 100 μm.

With respect to the fluoropolymer (1) and the fluoropolymer (2), "having a fluorinated alicyclic structure in its main chain" means one or more carbon atoms constituting the ring of the fluorinated alicyclic ring in the polymer are carbon atoms constituting the main chain of the polymer. Atoms constituting the ring of the fluorinated alicyclic ring may include oxygen atoms, nitrogen atoms, etc. in addition to the carbon atoms. A preferred fluorinated alicyclic ring is a fluorinated alicyclic ring having one or two oxygen atoms. The number of atoms constituting the fluorinated alicyclic ring is preferably from 4 to 7.

The carbon atoms constituting the main chain derive from carbon atoms of polymerizable double bonds in the case of a polymer obtained by polymerizing a cyclic monomer, and they derive from four carbon atoms of two polymerizable double bonds in the case of a polymer obtained by cyclopolymerization of a diene monomer.

The cyclic monomer is a monomer having a fluorinated alicyclic ring and having a polymerizable double bond between the carbon atom-carbon atom constituting such a fluorinated alicyclic ring, or a monomer having a fluorinated alicyclic ring and having a polymerizable double bond between a carbon atom constituting such a fluorinated alicyclic ring and a carbon atom other than the fluorinated alicyclic ring.

The diene monomer is a monomer having two polymerizable double bonds.

The cyclic monomer is preferably the following compound 1 or the following compound 2 (wherein $X^1$ is a fluorine atom or a $C_{1-3}$ perfluoroalkoxy group, each of $R^1$ and $R^2$ is a fluorine atom or a $C_{1-6}$ perfluoroalkyl group, and each of $X^2$ and $X^3$ is a fluorine atom or a $C_{1-9}$ perfluoroalkyl group).

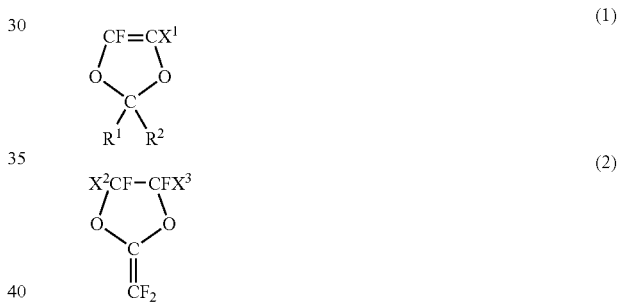

The following compounds may be mentioned as specific examples of the compound 1.

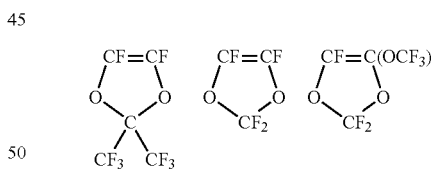

The following compounds may be mentioned as specific examples of the compound 2.

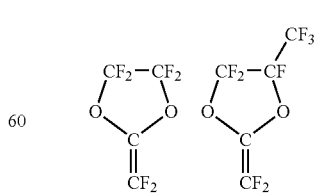

The diene monomer is preferably a monomer represented by the formula $CF_2=CF-Q-CF-CF_2$. Here, Q is a $C_{1-3}$ perfluoroalkylene group which may have an etheric oxygen atom. In the case of a perfluoroalkylene group having an etheric oxygen atom, the etheric oxygen atom may be present at one terminal of the group, or at each terminal of the group or between carbon atoms in the group. From the viewpoint of the cyclopolymerizability, it is preferably present at one terminal of the group.

By the cyclopolymerization of the above monomer, a fluoropolymer will be formed which contains at least one monomer unit selected from the group consisting of the following monomer unit (A), the following monomer unit (B) and the following monomer unit (C). In the fluoropolymer obtained by cyclopolymerization of a diene monomer, carbon atoms in the main chain derive from four carbon atoms of the two polymerizable double bonds.

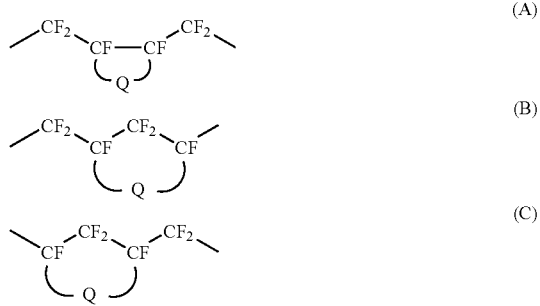

(A)

(B)

(C)

The following compounds may be mentioned as specific examples of the above monomer.

$CF_2=CFOCF_2CF=CF_2$
$CF_2=CFOCF(CF_3)CF=CF_2$
$CF_2=CFOCF_2CF_2CF=CF_2$
$CF_2=CFOCF(CF_3)CF_2CF=CF_2$
$CF_2=CFOCF_2CF(CF_3)CF=CF_2$
$CF_2=CFOCF_2OCF=CF_2$
$CF_2=CFOC(CF_3)_2OCF=CF_2$
$CF_2=CFCF_2CF=CF_2$
$CF_2=CFCF_2CF_2CF=CF_2$

In the cyclic monomer and the diene monomer, the proportion of the number of fluorine atoms bonded to carbon atoms to the total number of hydrogen atoms bonded to the carbon atoms and fluorine atoms bonded to the carbon atoms, is preferably at least 80%, particularly preferably 100%, in each case.

In the fluoropolymer (1) and the fluoropolymer (2), the proportion of repeating units having a fluorinated alicyclic structure to the total monomer units is preferably at least 20 mol %, more preferably at least 40 mol %, in each case, from the viewpoint of the transparency of the fluoropolymer. Particularly preferred is one composed solely of repeating units having a fluorinated alicyclic structure in their main chains. Here, the repeating units having a fluorinated alicyclic structure are monomer units formed by polymerization of a cyclic monomer or monomer units formed by cyclopolymerization of a diene monomer.

The repeating units having a fluorinated alicyclic structure in the fluoropolymer (2) and the repeating units having a fluorinated alicyclic structure in the fluoropolymer (1) are preferably the same repeating units. In such a case, the interlayer (A) and the surface layer (B) will be bonded more firmly, thus providing an effect such that the durability of the mold will be excellent.

The fluoropolymer (1) has reactive groups (y). The type of the reactive groups (y) is suitably selected depending upon the type of functional groups (x). In a case where the functional groups (x) are hydroxyl groups, oxiranyl group or amino groups, the reactive groups (y) are preferably carboxyl groups or derivatives thereof, particularly preferably carboxyl groups.

On the other hand, the fluoropolymer (2) has substantially no reactive groups (y). The term "having substantially no reactive groups (y)" means that the content of the reactive groups (y) in the fluoropolymer (2) is lower than the detective limit. Further, the fluoropolymer (2) preferably has substantially no reactive groups other than the reactive groups (y).

Each of the fluoropolymer (1) and the fluoropolymer (2) will be obtainable by a known method. For example, a fluoropolymer (1) wherein the reactive groups (y) are carboxyl groups, may be obtained by polymerizing a diene monomer or a cyclic monomer in the presence of a hydrocarbon type radical polymerization initiator to obtain a fluoropolymer having a fluorinated alicyclic structure in its main chain, then heat-treating the fluoropolymer in an oxygen gas atmosphere, and further immersing it in water. Further, by contacting such a fluorinated polymer with fluorine gas, it is possible to obtain a fluoropolymer (2) containing substantially no reactive groups (y).

The surface layer (B) in the present invention has a micropattern on its surface. The micropattern is preferably a micropattern constituted by a concavo-convex structure.

The convex portions in the concavo-convex structure are present in the form of lines or dots on the surface of the surface layer (B), and the shapes of such lines or dots are not particularly limited. The line-form convex portions are not limited to linear lines, and may be curved lines or bent lines. Further, a number of such lines may be present in parallel with one another to form stripes. The cross-sectional shape of the line-form convex portions (shape of the cross section in a direction perpendicular to the longitudinal direction of the lines) is not particularly limited, and it may, for example, be rectangular, trapezoidal, triangular or semi-circular. The shape of the dot-form convex portions is also not particularly limited. For example, it may be a columnar or conical shape with a bottom shape being rectangular, square, rhombic, hexagonal, triangular, circular or the like, a hemispherical shape or a polyhedral shape.

The average of widths (the widths of the bottom portions) of the line-form convex portions is preferably from 1 nm to 500 μm, particularly preferably from 10 nm to 300 μm. The average of lengths of the bottom faces of the dot-form convex portions is preferably from 1 nm to 500 μm, particularly preferably from 10 nm to 300 μm. However, in a case where the dots are elongated in the shape close to lines, the lengths of the bottom faces of the dot-form convex portions are meant for the lengths in a direction perpendicular to the elongated direction, and in other cases, they are meant for the maximum lengths of the bottom face shapes.

The average of heights of the line-form or dot-form convex portions is preferably from 1 nm to 500 μm, particularly preferably from 10 nm to 300 μm, most preferably from 10 nm to 10 μm. Further, the thickness of the surface layer (B) is preferably at least the height of the highest convex portions.

At a portion where the concavo-convex structure is present in a high density, the average of distances between adjacent convex portions (distances between the bottom portions) is preferably from 1 nm to 500 μm, particularly preferably from 10 nm to 300 μm. Thus, the minimum dimension of such a convex structure is preferably at most 500 μm, and the lower limit thereof is preferably 1 nm. The minimum dimension is meant for the minimum one among the width, length and height of such a convex structure.

The mold of the present invention is preferably a mold having a transparent substrate and a fluoropolymer layer having on its surface a micropattern for molding a photocurable resin, which comprises an interlayer (A) made of the fluoropolymer (1) formed on a surface of the transparent substrate having functional groups (x) on the surface on which the interlayer (A) is formed, and a surface layer (B) having a micropattern, made of a fluoropolymer (2) and formed on a surface of the interlayer (A).

In the mold of the present invention, the transparent substrate has functional groups (x) before the interlayer (A) is formed on its surface. When the interlayer (A) is formed on the surface of the transparent substrate, some or all of the functional groups (x) will form chemical bonds with some or all of the reactive groups (y) of the fluoropolymer (1). In a case where some of functional groups (x) of the transparent substrate form chemical bonds, the transparent substrate in the mold of the present invention still have functional groups (x). On the other hand, in a case where all of the functional groups (x) of the transparent substrate form chemical bonds, the transparent substrate in the mold of the present invention has no functional groups (x).

In any case, on the surface of the transparent substrate after forming the interlayer (A), chemical bonds formed from the functional groups (x) and the reactive groups (y) are present. Such chemical bonds may, for example, be ester bonds in a case where the functional groups (x) are carboxyl groups and the reactive groups (y) are hydroxyl groups or oxiranyl groups, or amide bonds in a case where the functional groups (x) are carboxyl groups and the reactive groups is (y) are amino groups. Thus, in the mold of the present invention, the transparent substrate and the interlayer (A) are firmly bonded via the chemical bonds.

Further, in the mold of the present invention, the fluoropolymer (1) constituting the interlayer (A) and the fluoropolymer (2) constituting the surface layer (B) are made of fluoropolymers having a common structure (i.e. a fluorinated alicyclic structure in their main chains), whereby the interlayer (A) and the surface layer (B) are firmly bonded. Therefore, in the present invention, the type or the shape of the transparent substrate can suitably be selected, and it is possible to provide a mold having high release properties, which has optional strength and shape.

As a specific embodiment of the mold of the present invention, a mold may, for example, be mentioned which is a mold for forming a photocurable resin, having a micropattern on its surface and which comprises a transparent substrate having a transmittance of light with a wavelength of from 200 to 500 nm being at least 90%, and a fluoropolymer formed on the substrate, which has a fluorinated alicyclic structure in its main chain and is treated with fluorine gas.

As a process for producing the mold of the present invention, a process may, for example, be mentioned wherein the following steps M1, M2, M3 and M4 are carried out sequentially.

Step M1

A step of applying a solution having a fluoropolymer (1) dissolved in a fluorinated solvent, on the surface side of a transparent substrate having functional groups (x) on the surface, followed by drying to remove the fluorinated solvent to form an interlayer (A) made of the fluoropolymer (1) on the surface side of the transparent substrate having functional groups (x) on the surface.

Step M2

A step of applying a solution having a fluoropolymer (2) dissolved in a fluorinated solvent, on the surface side of the interlayer (A), followed by drying to remove the fluorinated solvent to form a layer ($B^P$) made of the fluoropolymer (2) on the surface of the interlayer (A).

Step M3

A step of heating the layer ($B^P$) to at least the glass transition temperature of the fluoropolymer (2), or heating a mold having a reversed pattern of the micropattern to at least said glass transition temperature, followed by pressing the reversed pattern of the mold having on its surface the reversed pattern of the micropattern, on the layer ($B^P$) side.

Step M4

A step of cooling the layer ($B^P$) and the mold to at most the glass transition temperature of the fluoropolymer (2), followed by releasing the mold to form a surface layer (B) made of the fluoropolymer (2) having a transferred micropattern of the mold formed, on the surface of the interlayer (A).

The drying in Step M1 is carried out at a temperature capable of forming chemical bonds between some or all of functional groups (x) of the transparent substrate and some or all of reactive groups (y) of the fluoropolymer (1). The temperature for the drying is usually at least 100° C.

The drying in Step M2 is carried out preferably at a temperature of at least the glass transition temperature of the fluoropolymer (1) and at least the glass transition temperature of the fluoropolymer (2). In such a case, the interlayer (A) and the layer ($B^P$) will be firmly bonded.

The present invention provides a process for producing a base material having a transferred micropattern made of a cured product of a photocurable resin, which employs the mold produced by the above steps, a base material and a photocurable resin and which comprises sequentially carrying out a step (hereinafter referred to as Step 1) of interposing and pressing the photocurable resin between the micropattern surface of the mold and a surface of the base material, a step (hereinafter referred to as Step 2) of applying light from the mold side to cure the photocurable resin to form a cured product, and a step (hereinafter referred to as Step 3) of releasing the cured product from the mold.

The photocurable resin in the present invention is not particularly limited so long as it is a resin which is curable by irradiation with light to form a cured product. The mold of the present invention has high transparency within a wide wavelength range of light. Therefore, the wavelength of light for irradiation is not particularly limited. The wavelength of light is preferably from 200 to 500 nm, particularly preferably from 200 to 400 nm, whereby a usual photocurable resin can be cured at a low temperature.

The photocurable resin in the present invention is preferably a photocurable resin containing a polymerizable compound and a photopolymerization initiator. The polymerizable compound is not particularly limited so long as it is a compound having a polymerizable group, and it may be any of a polymerizable monomer, a polymerizable oligomer or a polymerizable polymer. The photopolymerization initiator is a photopolymerization initiator which induces a radical reaction or an ionic reaction by light. Further, the temperature of the system in Steps 1, 2 and 3 is preferably at most the glass transition temperature of the fluoropolymer (2).

The following Steps 11, 12 and 13 may be mentioned as specific embodiments of Step 1.

Step 11

A step of disposing a photocurable resin on the surface of a base material, and then sandwiching it between the base material and the mold so that the photocurable resin is in contact with the patterned surface of the mold, followed by pressing.

Step 12

A step of disposing a photocurable resin on the patterned surface of the mold, then sandwiching it between the base material and the mold so that the surface of the base material is in contact with the photocurable resin, followed by pressing.

Step 13

A step of combining the base material and the mold so that a space is formed between the base material surface and the patterned surface of the mold, then filling a photocurable resin into the space so that the photocurable resin is sandwiched between the patterned surface of the mold and the base material, followed by pressing.

The treated base material obtained by the process of the present invention has a transferred micropattern of a cured product of the photocurable resin formed on its surface. The transferred micropattern is a micropattern having the micropattern of the mold of the present invention inverted. The transferred micropattern is preferably a structure having a concavo-convex construction (hereinafter referred to also as a concavo-convex structure) made of a cured product of the photocurable resin. The concavo-convex structure may have a layer structure made of a continuous body having a concavo-convex shape on its surface, or may have a structure having independent projections assembled. The former is meant for a structure made of a layer of a cured product of the photocurable resin covering the base material surface, wherein the surface of the layer of the cured product of the photocurable resin has a concavo-convex shape. The latter is meant for a structure wherein many projections made of a cured product of the photocurable resin are independently present on the base material surface and constitute a concavo-convex shape together with concave portions made of the substrate material surface. In either case, the convex portions (projections) are made of the cured product of the photocurable resin. Further, the concavo-convex structure may have a structure wherein such two structures are co-existent at different positions on the base material surface.

The treated base material obtainable by the process of the present invention is useful as an optical element such as a microlens array, an optical waveguide, an optical switching, a fresnel zone plate, a binary element, a blaze element or a photonics crystal; an AR (anti reflection) coating material, a biochip, a chip for μm-TAS (micro-total analysis systems), a microreactor chip, a recording medium, a display material, a carrier for catalyst, a filter, a sensor component, etc.

EXAMPLES

Now, the present invention will be described in further detail with reference to Examples. However, it should be understood that the present invention is by no means restricted to such Examples.

Example 1

Preparation of polymer (P)

Into an autoclave (made of pressure resistant glass) 100 g of $CF_2$=$CFOCF_2CF_2CF$=$CF_2$, 0.5 g of methanol and 0.7 of $((CH_3)_2CHOCOO)_2$ were added, and polymerization was carried out by means of a suspension polymerization to obtain a polymer (P). The polymer (P) is a polymer made of a monomer unit represented by the following formula (P), and its intrinsic viscosity was 0.34 dl/g in perfluoro(2-butyltetrahydrofuran) at 30° C. The glass transition temperature of the polymer (P) was 108° C.

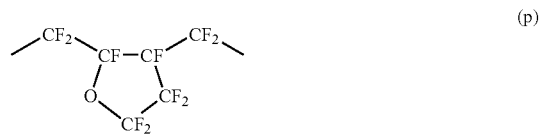

(p)

Example 2

Preparation of solution composition (hereinafter referred to as composition 1) containing a polymer (hereinafter referred to as polymer (11)) having a fluorinated alicyclic structure in its main chain and having carboxyl groups The polymer (P) was heat-treated at 300° C. for 1 hour in a hot air circulated oven, then immersed in ultrapure water at 110° C. for 1 week and further dried at 100° C. for 24 hours in a vacuum dryer to obtain polymer (11). The infrared absorption spectrum of the polymer (11) was measured, whereby a peak attributable to a carboxyl group was confirmed. The polymer (11) was processed into a film having a thickness of 100 μm, whereupon the transmittance of light with a wavelength of from 200 to 500 nm was measured, whereby it was found to be at least 93%. A perfluorotributylamine solution containing 1 mass % of the polymer (11) was prepared, and the solution was filtered through a membrane filter (pore diameter: 0.2 μm, made of PTFE) to obtain composition 1.

Example 3

Preparation of solution composition (hereinafter referred to as composition 2) containing a polymer (hereinafter referred to as polymer (21)) having a fluorinated alicyclic structure in its main chain and having no reactive groups The polymer (P) was put into an autoclave (made of nickel, internal capacity: 1 L), and the interior of the autoclave was flushed three times with nitrogen gas and then evacuated to 4.0 kPa (absolute pressure). Into the autoclave, fluorine gas diluted to 14 vol % with nitrogen gas was introduced to 101.3 kPa, whereupon the internal temperature of the autoclave was maintained to be 230° C. for 6 hours. The content of the autoclave was recovered to obtain polymer (21). The infrared absorption spectrum of the polymer (21) was measured, whereby no peak attributable to a carboxyl group was confirmed. The polymer (21) was processed into a film having a thickness of 100 μm, and the transmittance of light with a wavelength of from 200 to 500 nm was measured, whereby it was found to be at least 95%. A perfluorotributylamine solution containing 9 mass % of the polymer (21) was prepared, and the solution was filtered through a membrane filter (opening diameter: 0.2 μm, made of PTFE) to obtain composition 2.

Example 4

Preparation of Mold (Case 1)

An ethanol solution containing 0.5 mass % of a silane coupling agent having an amino group (KBE-903, manufactured by Shin-Etsu Chemical Co., Ltd.) and 5 mass % of water, was applied on a quartz substrate (25 mm in length×25 mm in width×1 mm in thickness) having a transmittance of light with a wavelength of from 200 to 500 nm being at least 90%, by means of a spin coating method. The quartz substrate was washed with water and then heated and dried at 70° C. for 1 hour to carry out surface treatment to introduce amino groups derived from the silane coupling agent to the surface of the quartz substrate.

Then, on the surface of the quartz substrate subjected to the surface treatment, the composition 1 obtained in Example 2 was applied by a spin coating method and then heated and dried at 180° C. for 1 hour to evaporate the perfluorotributylamine in the composition 1. At the same time, amino groups on the quartz substrate surface were chemically-bonded with the carboxyl groups of the polymer (11) to obtain a quartz substrate having a layer made of the polymer (11) having amide bonds formed with amino groups, formed on its surface.

Then, the composition 2 obtained in Example 3 was applied on the layer by means of a spin coating method and then heated and dried at 180° C. for 1 hour to evaporate perfluorotributylamine in the composition 2. As a result, a quartz substrate having a layer of the polymer (21) (layer thickness: 1.3 μm) formed as the outermost surface, was obtained.

Further, a mold made of silicon having a concavo-convex structure wherein concaves having a depth of 100 nm and a width of 0.7 μm were disposed at 9.3 μm intervals, was heated to 120° C. and pressed against the layer side made of the polymer (21) under 2.0 MPa (absolute pressure) for 10 minutes. After the mold and the quartz substrate were cooled to a temperature of at most 30° C., the mold was released.

As a result, a mold comprising the quartz substrate, the polymer (11) layer and the polymer (21) layer and having a micropattern (a concavo-convex structure having convex portions of 100 nm in height×0.7 μm in width disposed at 9.3 μm intervals) on the outermost surface of the polymer (21), was obtained.

Example 5

Preparation of Mold for Forming Photocurable Resin (Case 2)

The same ethanol solution and quartz substrate as in Example 4 were prepared, and a quartz substrate subjected to the same surface treatment, was obtained. Then, using a spin coating method, the composition 1 obtained in Example 2 was applied to the surface-treated side of the quartz substrate and then heated and dried at 180° C. for 1 hour. Then, using a spin coating method, the composition 2 obtained in Example 3 was applied on the surface and heated and dried at 180° C. for 1 hour to obtain a quartz substrate having a thin film (thickness: 1.3 μm) of the polymer (21) formed. Then, the same mold made of silicon as in Example 4 was heated to 120° C. and then pressed against the thin film side of the quartz substrate under a pressure of 2.0 MPa (absolute pressure) for 10 minutes.

Further, after cooling the mold and the quartz substrate to a temperature of at most 30° C., the mold was released from the quartz substrate, to obtain the quartz substrate having formed a thin film of the polymer (21) on which the concavo-convex structure of the mold was transferred. On the surface of the thin film, a concavo-convex structure was formed wherein convex portions of 100 nm in height×0.7 μm in width were disposed at 9.3 μm intervals.

Example 6

Preparation of Treated Base Material Having Micropattern Formed on its Surface

In a clean room shielded against ultraviolet light, 1.31 g of $CF_2=CFCF_2C(CF_3)$ $(OCH_2OCH_3)$ $CH_2CH=CH_2$, 0.14 g of $CF_2=CFCF_2C(CF_3)$ (OH) $CH_2CH=CH_2$, 0.03 g of a photocuring initiator 1 (IRGACURE 651, manufactured by Ciba Specialty Chemicals) and 0.03 g of a photocuring initiator 2 (IRGACURE 907, manufactured by Ciba Specialty Chemicals) were sequentially mixed to obtain a photo-curable resin.

Two drops of the photo-curable resin were applied on a silicon wafer to obtain a silicon wafer having a thin film (thickness: 2.5 μm) of the photo-curable resin formed. The thin film side was pressed against the micropattern surface of the mold obtained in Example 5. From the mold side, ultraviolet light (wavelength: 365 nm, illuminance: 63 mW/cm$^2$) was applied for 10 seconds to cure the photo-curable resin. Then, the mold was released to obtain a silicon wafer having on its surface a micropattern (a concavo-convex structure wherein concave portions having a depth of 99 nm and a width of 0.7 μm were disposed at 9.3 μm intervals) formed as the convex portions of the mold were inverted and made of a cured product of the photocurable resin.

INDUSTRIAL APPLICABILITY

The mold of the present invention is useful as a mold for nano imprinting employing a photo-curable resin. A treated base material obtained by using the mold of the present invention has a micropattern on its surface, and thus is useful for various applications. Such a treated base material may, for example, be an optical element (a microlens array, an optical waveguide, an optical switching, a fresnel zone plate, a binary optical element, a blaze optical element or a photonics crystal), an anti-reflection filter, a biochip, a microreactor chip, a recording medium, a display material or a carrier for catalysts.

The entire disclosures of Japanese Patent Application No. 2004-346029 filed on Nov. 30, 2004 and Japanese Patent Application No. 2005-247722 filed on Aug. 29, 2005 including specifications, claims, and summaries are incorporated herein by reference in their entireties.

What is claimed is:

1. A mold having a transparent substrate and a fluoropolymer layer having on its surface a micropattern for molding a photocurable resin, which comprises an interlayer (A) made of the following fluoropolymer (1) formed on a surface of the transparent substrate having functional groups (x) on the surface on which the following interlayer (A) is formed; and a surface layer (B) having a micropattern, made of the following fluoropolymer (2) and formed on a surface of the interlayer (A):

Interlayer (A): a layer made of a fluoropolymer (1) which is a fluoropolymer having a fluorinated alicyclic structure in its main chain and which has reactive groups (y) reactive with said functional groups (x)

Surface layer (B): a layer made of a fluoropolymer (2) which is a fluoropolymer having a fluorinated alicyclic structure in its main chain and which has substantially no reactive groups (y).

2. The mold according to claim 1, wherein the micropattern of the mold is constituted by a concavo-convex structure wherein an average height of convex portions is from 1 nm to 300 μm.

3. The mold according to claims 1, wherein the functional groups (x) are hydroxyl groups, amino groups or oxiranyl groups, and the reactive groups (y) are carboxyl groups.

4. The mold according to claim 1, wherein the transparent substrate having functional groups (x) on its surface is a glass substrate having functional groups (x) introduced by surface treatment.

5. A process for producing a base material having a transferred micropattern made of a cured product of a photocurable resin, which employs the mold as defined in claim 1, a base material and a photocurable resin and which comprises sequentially carrying out a step of interposing and pressing the photocurable resin between the micropattern surface of the mold and a surface of the base material, a step of applying light from the mold side to cure the photocurable resin to form a cured product, and a step of releasing the cured product from the mold.

6. The mold according to claim 4, wherein said surface treatment comprises applying a silene coupling agent having a functional group (x) or a silazane compound having a functional group (x) to said surface.

7. The mold according to claim 1, wherein at least one of fluorpolymer (1) fluorpolymer (2) comprises a fluorinated alicyclic ring having one or two oxygen atoms, and the number of atoms constituting the fluorinated alicyclic ring is from 4 to 7.

* * * * *